US009529060B2

(12) United States Patent
Fermon et al.

(10) Patent No.: US 9,529,060 B2
(45) Date of Patent: Dec. 27, 2016

(54) MAGNETORESISTANCE ELEMENT WITH IMPROVED RESPONSE TO MAGNETIC FIELDS

(71) Applicant: Allegro MicroSystems, LLC, Worcester, MA (US)

(72) Inventors: Claude Fermon, Orsay (FR); Myriam Pannetier-Lecoeur, Bures sur Yvette (FR); Marie-Claire Cyrille, Sinard (FR); Cyril Dressler, Tullins (FR); Paolo Campiglio, Montrouge (FR)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

(21) Appl. No.: 14/452,783

(22) Filed: Aug. 6, 2014

(65) Prior Publication Data
US 2015/0194597 A1    Jul. 9, 2015

Related U.S. Application Data

(60) Provisional application No. 61/925,446, filed on Jan. 9, 2014.

(51) Int. Cl.
*H01L 43/08* (2006.01)
*G01R 33/09* (2006.01)
(Continued)

(52) U.S. Cl.
CPC .......... *G01R 33/09* (2013.01); *G01R 33/0052* (2013.01); *G01R 33/093* (2013.01); *G01R 33/098* (2013.01); *G11B 5/3903* (2013.01); *G11B 5/3906* (2013.01); *G11B 5/3909* (2013.01); *H01F 10/3263* (2013.01); *H01F 10/3272* (2013.01); *H01F 41/306* (2013.01); *H01L 43/02* (2013.01); *H01L 43/08* (2013.01); *H01L 43/10* (2013.01); *H01L 43/12* (2013.01); *Y10T 29/41* (2015.01)

(58) Field of Classification Search
None
See application file for complete search history.

(56) References Cited

U.S. PATENT DOCUMENTS 5,282,104 A    1/1994  Coutellier et al.
5,677,625 A   10/1997  Dieny
(Continued)

FOREIGN PATENT DOCUMENTS

CN    201622299    11/2010
CN    101900754    12/2010
(Continued)

OTHER PUBLICATIONS

Office Action dated Jun. 17, 2015; for U.S. Appl. No. 14/529,564; 26 pages.
(Continued)

*Primary Examiner* — Minh-Loan Tran
(74) *Attorney, Agent, or Firm* — Daly, Crowley, Mofford & Durkee, LLP (57) ABSTRACT

A magnetoresistance element has a double pinned arrangement with two antiferromagnetic pinning layers, two pinned layers, and a free layer. A spacer layer between one of the two antiferromagnetic pinning layers and the free layer has a material selected to allow a controllable partial pinning by the one of the two antiferromagnetic pinning layers.

28 Claims, 7 Drawing Sheets

(51) Int. Cl.

| | | |
|---|---|---|
| G01R 33/00 | (2006.01) | |
| G11B 5/39 | (2006.01) | |
| H01L 43/02 | (2006.01) | |
| H01L 43/10 | (2006.01) | |
| H01L 43/12 | (2006.01) | |
| H01F 10/32 | (2006.01) | |
| H01F 41/30 | (2006.01) | |

(56) References Cited

U.S. PATENT DOCUMENTS

| | | |
|---|---|---|
| 5,686,838 A | 11/1997 | van den Berg |
| 5,821,517 A | 10/1998 | Fedeli et al. |
| 5,858,125 A | 1/1999 | Hasegawa |
| 5,895,727 A | 4/1999 | Hasegawa |
| 5,923,514 A | 7/1999 | Scott et al. |
| 5,933,306 A | 8/1999 | Santos et al. |
| 6,013,365 A | 1/2000 | Dieny et al. |
| 6,026,355 A | 2/2000 | Rahman et al. |
| 6,069,476 A | 5/2000 | Vieux-Rochaz et al. |
| 6,094,330 A | 7/2000 | Criniti et al. |
| 6,141,197 A | 10/2000 | Kim et al. |
| 6,373,247 B1 | 4/2002 | Marx et al. |
| 6,429,640 B1 | 8/2002 | Daughton et al. |
| 6,462,641 B1 | 10/2002 | Dieny et al. |
| 6,490,140 B1 | 12/2002 | Mao et al. |
| 6,522,132 B1 | 2/2003 | Vieux-Rochaz et al. |
| 6,532,164 B2 | 3/2003 | Redon et al. |
| 6,549,382 B1 * | 4/2003 | Gill .................. B82Y 10/00 360/314 |
| 6,556,390 B1 | 4/2003 | Mao et al. |
| 6,603,677 B2 | 8/2003 | Redon et al. |
| 6,738,236 B1 | 5/2004 | Mao et al. |
| 6,770,382 B1 | 8/2004 | Chang et al. |
| 7,095,596 B2 | 8/2006 | Schmollngruber et al. |
| 7,106,046 B2 | 9/2006 | Nagano et al. |
| 7,176,679 B2 | 2/2007 | Baragatti et al. |
| 7,288,931 B2 | 10/2007 | Granig et al. |
| 7,324,312 B2 * | 1/2008 | Gill .................. B82Y 10/00 324/252 |
| 7,324,313 B2 * | 1/2008 | Childress ............ B82Y 10/00 360/324.12 |
| 7,342,753 B2 | 3/2008 | Gill |
| 7,394,247 B1 | 7/2008 | Guo et al. |
| 7,397,637 B2 | 7/2008 | Gill |
| 7,453,672 B2 | 11/2008 | Dieny et al. |
| 7,463,016 B2 | 12/2008 | Shoji |
| 7,472,004 B2 | 12/2008 | Hara et al. |
| 7,713,755 B1 | 5/2010 | Xiao |
| 7,759,933 B2 | 7/2010 | Coillot et al. |
| 7,813,202 B2 | 10/2010 | Rodmacq et al. |
| 7,855,555 B2 | 12/2010 | Biziere et al. |
| 7,902,811 B2 | 3/2011 | Shoji |
| 7,944,205 B2 | 5/2011 | Fermon et al. |
| 7,944,736 B2 | 5/2011 | Dieny et al. |
| 7,999,338 B2 | 8/2011 | Zheng et al. |
| 8,093,886 B2 | 1/2012 | Okada et al. |
| 8,129,988 B2 | 3/2012 | Fermon et al. |
| 8,223,463 B2 * | 7/2012 | Katada ................ B82Y 25/00 360/324.12 |
| 8,279,666 B2 | 10/2012 | Dieny et al. |
| 8,487,701 B2 | 7/2013 | Boujamaa et al. |
| 8,513,944 B2 | 8/2013 | Rodmacq et al. |
| 8,542,072 B2 | 9/2013 | Dieny et al. |
| 8,624,590 B2 | 1/2014 | Dieny |
| 8,669,122 B2 | 3/2014 | Viala et al. |
| 8,779,764 B2 | 7/2014 | Meguro et al. |
| 8,836,317 B2 | 9/2014 | Kasajima |
| 8,847,589 B2 | 9/2014 | Walther et al. |
| 2001/0030839 A1 | 10/2001 | Zhong et al. |
| 2002/0061421 A1 | 5/2002 | Dieny |
| 2002/0158626 A1 | 10/2002 | Shay et al. |
| 2002/0171417 A1 | 11/2002 | Schoedlbauer |
| 2002/0186513 A1 | 12/2002 | Heinonen et al. |
| 2003/0020471 A1 | 1/2003 | Kohlstedt |
| 2003/0053266 A1 | 3/2003 | Dieny et al. |
| 2003/0053270 A1 * | 3/2003 | Gill .................. B82Y 10/00 360/324.11 |
| 2003/0070497 A1 | 4/2003 | Kikuchi et al. |
| 2003/0184918 A1 | 10/2003 | Lin et al. |
| 2003/0218840 A1 | 11/2003 | Apel et al. |
| 2003/0226409 A1 | 12/2003 | Steele et al. |
| 2003/0235016 A1 * | 12/2003 | Gill .................. G11B 5/3903 360/324.12 |
| 2004/0008454 A1 | 1/2004 | Gill |
| 2004/0056647 A1 | 3/2004 | Stauth et al. |
| 2004/0056654 A1 | 3/2004 | Goldfine et al. |
| 2004/0207035 A1 | 10/2004 | Witcraft et al. |
| 2004/0263157 A1 | 12/2004 | Sudo et al. |
| 2006/0038407 A1 | 2/2006 | Shelley et al. |
| 2006/0077598 A1 | 4/2006 | Taylor et al. |
| 2006/0091993 A1 | 5/2006 | Shoji |
| 2006/0114098 A1 | 6/2006 | Shoji |
| 2006/0152859 A1 | 7/2006 | Childress et al. |
| 2006/0193089 A1 | 8/2006 | Li et al. |
| 2006/0214656 A1 | 9/2006 | Sudo et al. |
| 2007/0019338 A1 | 1/2007 | Childress et al. |
| 2007/0019341 A1 | 1/2007 | Mizuno et al. |
| 2007/0044370 A1 | 3/2007 | Shoji |
| 2007/0063237 A1 | 3/2007 | Huai et al. |
| 2007/0064350 A1 | 3/2007 | Gill |
| 2007/0076332 A1 | 4/2007 | Shoji et al. |
| 2007/0164734 A1 | 7/2007 | Shimizu et al. |
| 2007/0230067 A1 | 10/2007 | Jogo et al. |
| 2007/0230068 A1 | 10/2007 | Gill |
| 2008/0031035 A1 | 2/2008 | Rodmaco et al. |
| 2008/0098167 A1 | 4/2008 | Rodmaco et al. |
| 2008/0151615 A1 | 6/2008 | Rodmaco et al. |
| 2008/0316655 A1 | 12/2008 | Shoji |
| 2009/0015972 A1 | 1/2009 | Dieny et al. |
| 2009/0021249 A1 | 1/2009 | Kumar et al. |
| 2009/0087589 A1 | 4/2009 | Guo et al. |
| 2009/0115405 A1 | 5/2009 | Guo |
| 2009/0189601 A1 | 7/2009 | Okada et al. |
| 2009/0192755 A1 | 7/2009 | Sheiretov et al. |
| 2009/0289694 A1 | 11/2009 | Rieger et al. |
| 2009/0290053 A1 | 11/2009 | Hammerschmidt |
| 2010/0027168 A1 | 2/2010 | Chou et al. |
| 2010/0039734 A1 | 2/2010 | Hara et al. |
| 2010/0045277 A1 | 2/2010 | Goldfine et al. |
| 2010/0060263 A1 | 3/2010 | Granig et al. |
| 2010/0149689 A1 | 6/2010 | Tsuchiya et al. |
| 2011/0025320 A1 | 2/2011 | Ohta et al. |
| 2011/0068786 A1 | 3/2011 | Miura et al. |
| 2011/0133728 A1 | 6/2011 | Tokunaga |
| 2011/0140217 A1 | 6/2011 | Nguyen et al. |

FOREIGN PATENT DOCUMENTS

| | | |
|---|---|---|
| DE | 19 810 838 | 9/1999 |
| DE | 19 843 348 | 3/2000 |
| DE | 10 222 467 | 12/2003 |
| DE | 10 257 253 | 2/2004 |
| DE | 10 2005 024 879 | 12/2006 |
| DE | 10 2005 042 307 | 3/2007 |
| DE | 10 2006 019 483 | 10/2007 |
| DE | 10 2008 030 334 | 1/2010 |
| EP | 779632 | 6/1997 |
| EP | 0 863 406 | 9/1998 |
| EP | 1 323 856 | 7/2003 |
| EP | 1 510 787 | 3/2005 |
| EP | 1 617 472 | 1/2006 |
| EP | 1 666 894 | 6/2006 |
| EP | 1 672 321 | 6/2006 |
| EP | 1 777 440 | 4/2007 |
| EP | 1 918 678 | 5/2008 |
| EP | 1 947 469 | 7/2008 |
| FR | 2 727 778 | 6/1996 |
| FR | 2 729 790 | 7/1996 |
| FR | 2 752 302 | 2/1998 |
| FR | 2 773 395 | 7/1999 |
| FR | 2 774 774 | 8/1999 |
| FR | 2 814 592 | 3/2002 |
| FR | 2 817 998 | 6/2002 |

(56) References Cited

FOREIGN PATENT DOCUMENTS

| | | |
|---|---|---|
| FR | 2 817 999 | 6/2002 |
| FR | 2 830 621 | 4/2003 |
| FR | 2 876 800 | 4/2006 |
| FR | 2 889 348 | 2/2007 |
| FR | 2 932 315 | 12/2009 |
| JP | 2000-055997 | 2/2000 |
| JP | 2000-055999 | 2/2000 |
| JP | 2000-056000 | 2/2000 |
| JP | 2001-230741 | 8/2001 |
| JP | 2002-082136 | 3/2002 |
| JP | 2002-267692 | 9/2002 |
| JP | 2002-328140 | 11/2002 |
| JP | 2003-315091 | 11/2003 |
| JP | 2006-214091 | 8/2006 |
| JP | 2007-101253 | 4/2007 |
| JP | 2007-108069 | 4/2007 |
| JP | 2009-014544 | 1/2009 |
| WO | WO 94/15223 | 7/1994 |
| WO | WO 01/67085 | 9/2001 |
| WO | WO 02/84680 | 10/2002 |
| WO | WO 03/032338 | 4/2003 |
| WO | WO 03/104829 | 12/2003 |
| WO | WO 03/107018 | 12/2003 |
| WO | WO 2004/048986 | 6/2004 |
| WO | WO 2004/068152 | 8/2004 |
| WO | WO 2004/068158 | 8/2004 |
| WO | WO 2005/020242 A2 | 3/2005 |
| WO | WO 2005/028993 | 3/2005 |
| WO | WO 2006/136577 | 12/2006 |
| WO | WO 2008/138577 | 12/2006 |
| WO | WO 2007/095971 | 8/2007 |
| WO | WO 2007/148028 | 12/2007 |
| WO | WO 2007/148029 | 12/2007 |
| WO | WO 2008/012309 | 1/2008 |
| WO | WO 2008/015354 | 2/2008 |
| WO | WO 2009/001160 | 12/2008 |
| WO | WO 2009/001162 | 12/2008 |
| WO | WO 2009/007324 | 1/2009 |
| WO | WO 2009/110892 | 9/2009 |
| WO | WO 2010/001077 | 1/2010 |
| WO | WO 2010/026948 | 3/2010 |
| WO | WO 2010/066976 | 6/2010 |
| WO | WO 2010/084165 | 7/2010 |
| WO | WO 2010/113820 | 10/2010 |
| WO | WO 2010/116102 | 10/2010 |
| WO | WO 2010/136527 | 12/2010 |
| WO | WO 2011/007767 | 1/2011 |

OTHER PUBLICATIONS

Response dated Nov. 17, 2015 to Office Action dated Jun. 17, 2015; For U.S. Appl. No. 14/529,564; 19 pages.
U.S. Appl. No. 14/529,564, filed Oct. 31, 2014, Campiglio et al.
Childress et al; "Spin-Valve and Tunnel-Valve Structures with In Situ In-Stack Bias;" IEEE Transactions on Magnetics, vol. 38, No. 5; Sep. 2002; pp. 2286-2288.
Coehoorn, Lecture Notes; "Novel Magnetoelectronic Materials and Devices;" Jan. 2003; pp. 33-84.
Fermon et al.; "Optimised GMR Sensors for Low and High Frequencies Applications;" Elsevier, Sensors and Actuators, Jan. 2006; 4 pages.
Noziéres et al.; "Blocking Temperature Distribution and Long-Term Stability of Spin-Vavle Structures with Mn-Based Antiferromagnets;" Journal of Applied Physics, vol. 87, No. 8; Apr. 15, 2000; pp. 3920-3925.
PCT Search Report and Written Opinion of the ISA dated Jun. 2, 2015; for PCT Pat. App. No. PCT/US2015/010417; 13 pages.
PCT Search Report and Written Opinion of the ISA dated Jun. 2, 2015; for PCT Pat. App. No. PCT/US2015/010422; 12 pages.
Office Action/Restriction Requirement dated Apr. 20, 2015; for U.S. Appl. No. 14/529,564: 9 pages.
Response filed Apr. 28, 2015; to Office Action/Restriction Requirement dated Apr. 20, 2015: for US. Appl. No. 14/629,564; 1 page.
U.S. Appl. No. 14/591,213, filed Jan. 7, 2015, Dressler et al.
Office Action/Restriction Requirement dated Apr. 20, 2015; for U.S. Appl. No. 14/529,564; 9 pages.
Final Office Action dated Feb. 4, 2016; U.S. Appl. No. 14/529,564; 24 pages.
Response dated Apr. 29, 2016 to Final Office Action dated Feb. 4, 2016; For U.S. Appl. No. 14/529,564; 17 pages.
Request for Continued Examination dated May 26, 2016; For U.S. Appl. No. 14/529,564; 3 pages.
U.S. Appl. No. 15/165,322, filed May 26, 2016, Fermon, et al.
Office Action dated Jun. 23, 2016; For U.S. Appl. No. 14/529,564; 17 pages.
PCT International Search Report and Written Opinion dated Aug. 10, 2016 corresponding to International Application No. PCT/US2016/034237; 21 Pages.
PCT International Preliminary Report on Patentability and Written Opinion dated Jul. 21, 2016 corresponding to International Application No. PCT/US2015/010422; 9 Pages.
Response filed Sep. 12, 2016; to Office Action dated Jun. 23, 2016 for U.S. Appl. No. 14/255,166; 25 pages.

* cited by examiner

MAGNETORESISTANCE ELEMENT WITH IMPROVED RESPONSE TO MAGNETIC FIELDS

CROSS REFERENCE TO RELATED APPLICATIONS

This application claims the benefit under 35 U.S.C. §119 (e) of U.S. Provisional Application No. 61/925,446 filed Jan. 9, 2014, which application is incorporated herein by reference in its entirety.

STATEMENT REGARDING FEDERALLY SPONSORED RESEARCH

Not Applicable.

FIELD

This invention relates generally to spin electronics magnetoresistance elements and, more particularly, to giant magnetoresistance (GMR) elements and tunnel magnetoresistance (TMR) elements that have an improved response to magnetic fields.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), and a tunneling magnetoresistance (TMR) element, also called a magnetic tunnel junction (MTJ) element.

Of these magnetoresistance elements, the GMR and the TMR elements operate with spin electronics (i.e., electron spins), which result in a resistance of the GMR element or the TMR element being related to an angular direction of a magnetization in a so-called "free-layer." The free layer is described more fully below.

The magnetoresistance element may be a single element or, alternatively, may include two or more magnetoresistance elements arranged in various configurations, e.g., a half bridge or full (Wheatstone) bridge.

As is known, metal based or metallic magnetoresistance elements (e.g., GMR, TMR, AMR) tend to have axes of sensitivity parallel to a substrate on which they are formed.

As used herein, the term "magnetic field sensor" is used to describe a circuit that uses a magnetic field sensing element, generally in combination with other circuits. In a typical magnetic field sensor, the magnetic field sensing element and the other circuits can be integrated upon a common substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field.

GMR and TMR elements are known to have a relatively high sensitivity, compared, for example, to Hall elements. GMR and TMR elements are also known to have moderately good linearity, but over a restricted range of magnetic fields, more restricted in range than a range over which a Hall element can operate. However, it is known that even in the restricted range of magnetic fields, the linearity of the GMR or TMR element suffers from irregularities. Thus, it would be desirable to provide a GMR or a TMR element for which linearity irregularities are reduced.

SUMMARY

The present invention provides a GMR or a TMR element (or any spin electronics magnetoresistance element) for which linearity irregularities are reduced.

In accordance with an example useful for understanding an aspect of the present invention, a magnetoresistance element includes a substrate and a first layer disposed over the substrate, the first layer comprising a seed layer. The magnetoresistance element also includes a second layer disposed over the substrate, the second layer comprising a first antiferromagnetic pinning layer. The magnetoresistance element also includes a third layer disposed over the substrate and proximate to the second layer, the third layer comprising a first pinned layer, wherein a position of the second layer is selected to influence a magnetization of the third layer. The magnetoresistance element also includes a fourth layer disposed over the substrate and proximate to the third layer, the fourth layer comprising a first nonmagnetic spacer layer. The magnetoresistance element also includes a fifth layer disposed over the substrate and proximate to the fourth layer, the fifth layer comprising a free layer, the free layer having a plurality of magnetic domains. The plurality of magnetic domains comprise: a first plurality of magnetic domains with magnetic fields pointing in a first direction; and a second plurality of magnetic domains with magnetic fields pointing in one or more directions different than the first direction. The magnetoresistance element also includes a sixth layer disposed over the substrate, the sixth layer comprising a second pinned layer. The magnetoresistance element also includes a seventh layer disposed over the substrate and proximate to the sixth layer, the seventh layer comprising a second antiferromagnetic pinning layer. A position of the seventh layer is selected to influence a magnetization of the sixth layer. The sixth layer is at a selected position relative to the fifth layer. The selected position of the sixth layer relative of the fifth layer results in a selected reduction in a quantity of magnetic domains within the second plurality of magnetic domains in the fifth layer without fully pinning the fifth layer. The magnetoresistance element also includes an eighth layer disposed between the fifth layer and the sixth and seventh layers taken together. The eighth layer includes a second nonmagnetic spacer layer. A material of the eighth layer is selected to allow a thickness of the eighth layer to be greater than 0.5 nm while allowing a desired partial pinning between the fifth layer and the sixth layer.

In accordance with another example useful for understanding an aspect of the present invention, a method of fabricating a magnetoresistance element includes depositing a double pinned magnetoresistance element upon a substrate. The double pinned magnetoresistance element includes a first antiferromagnetic pinning layer. The double pinned magnetoresistance element also includes a first pinned layer proximate to the antiferromagnetic pinning layer. The double pinned magnetoresistance element also includes a first nonmagnetic spacer layer disposed proximate to the first antiferromagnetic pinning layer. The double pinned magnetoresistance element also includes a second pinned layer. The double pinned magnetoresistance element also includes a second antiferromagnetic pinning layer proximate to the second pinned layer. The double pinned magnetoresistance element also includes a free layer between the first and second pinned layers. The double pinned magnetoresistance element also includes a second nonmagnetic spacer layer between the second pinned layer and the free layer. A material of the second nonmagnetic spacer layer is selected to allow a thickness of the second nonmagnetic spacer layer to be greater than 0.5 nm while allowing a desired partial pinning between the second pinned layer and the free layer.

BRIEF DESCRIPTION OF THE DRAWINGS

The foregoing features of the invention, as well as the invention itself may be more fully understood from the following detailed description of the drawings, in which.

DETAILED DESCRIPTION

Before describing the present invention, it should be noted that reference is sometimes made herein to GMR or TMR elements having particular shapes (e.g., yoke shaped). One of ordinary skill in the art will appreciate, however, that the techniques described herein are applicable to a variety of sizes and shapes.

As used herein, the term "anisotropy" or "anisotropic" refer to a particular axis or direction to which the magnetization of a ferromagnetic or ferrimagnetic layer tends to orientate when it does not experience an additional external field. An axial anisotropy can be created by a crystalline effect or by a shape anisotropy, both of which allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be aligned along that anisotropy in the absence of an external field. In case of a GMR or TMR element, a directional anisotropy provides an ability to obtain a coherent rotation of the magnetic field in a magnetic layer in response, for example, to an external magnetic field.

As used herein, the term "magnetic field sensing element" is used to describe a variety of electronic elements that can sense a magnetic field. A magnetoresistance element is but one type of magnetic field sensing elements.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Structures and methods described herein apply to both GMR and TMR magnetoresistance elements. However, it should be appreciated that the same or similar structures and methods can apply to other spin electronics magnetoresistance elements, either now known or later discovered.

Figure 1:
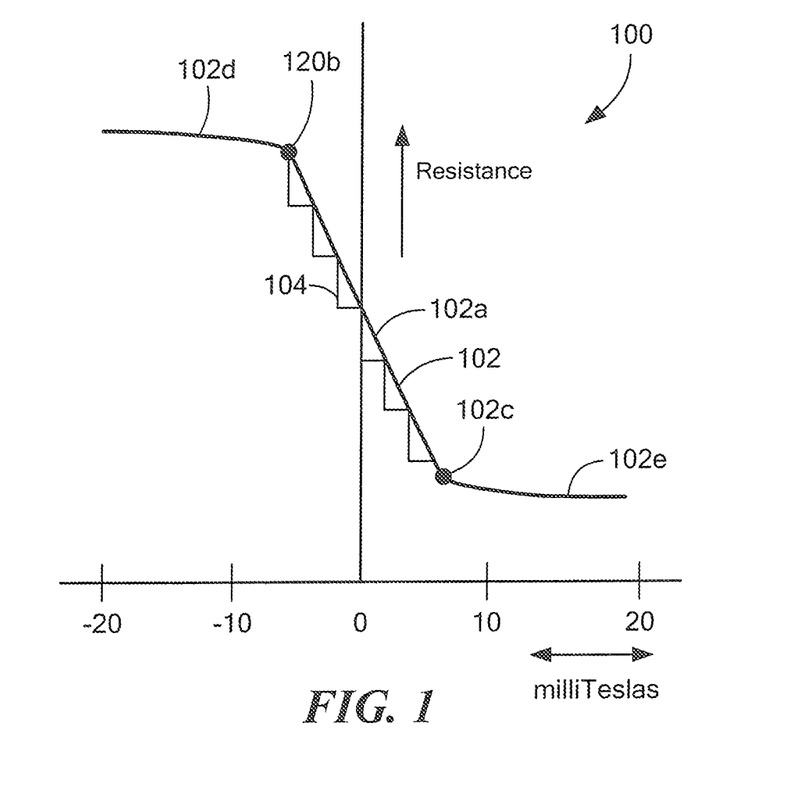
FIG. 1 is a graph showing an ideal and an actual transfer characteristic of a giant magnetoresistance (GMR) element.

Referring now to FIG. 1, a graph 100 has a horizontal axis with a scale in units of magnetic field in milliTesla (mT) and a vertical axis with a scale in units of resistance in arbitrary units.

A curve 102 is representative of a transfer function of an ideal GMR element, i.e., resistance versus magnetic field experienced by the GMR element. The transfer function 102 has a linear region 102a between an upper saturation point 102b and a lower saturation point 102c. Regions 102d, 102e are in saturation. It should be understood that the linear region 102a is an ideal linear region.

Steps, e.g., a step 104, are representative of an actual transfer function of the GMR element. Beyond the saturation points 102b, 102c, the actual transfer function represented by the steps 104 merges with the saturation regions 102d, 102e.

The steps 104 are not desirable. The steps 104 result from magnetic behavior of magnetic domains within a so-called free layer in a GMR element. Behavior of the free layer is described more fully below in conjunction with FIG. 2.

While the steps 104 are shown to be regular steps with equal spacing and equal step heights, the steps 104 can also be irregular, with unequal spacing and unequal step heights (i.e., amplitudes).

Figure 2:
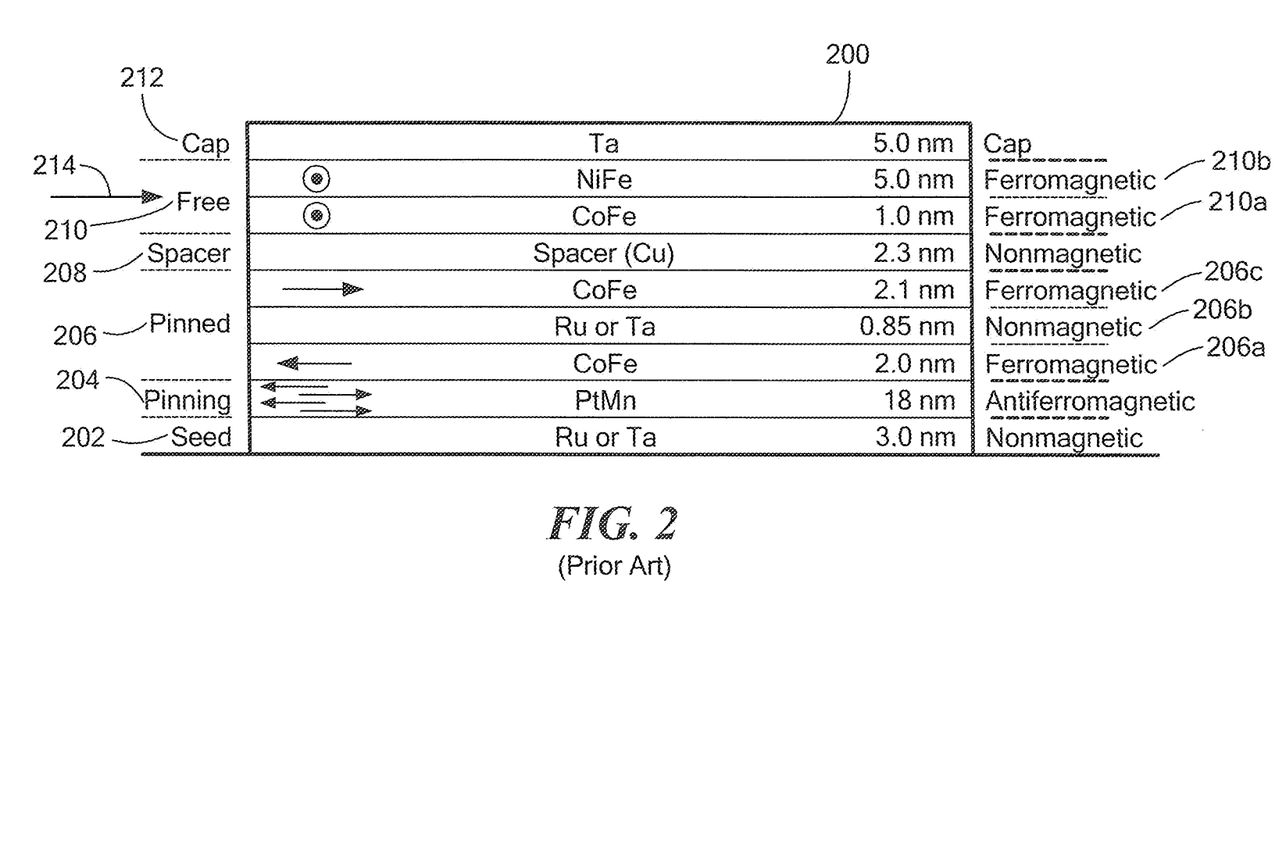
FIG. 2 is a block diagram showing layers of a conventional prior art GMR element with a single pinned arrangement.

Referring now to FIG. 2, a conventional prior art GMR element 200 includes a plurality of layers disposed over a substrate. An upper surface of the substrate is shown as a lowermost line at the bottom of FIG. 2.

On the left side of FIG. 2, each layer is identified by functional name. On the right side or FIG. 2 are shown magnetic characteristics of sub-layers that can form the functional layers. In general, magnetic materials can have a variety of magnetic characteristics and can be classified by a variety of terms, including, but not limited to, ferromagnetic, antiferromagnetic, and nonmagnetic. Description of the variety of types of magnetic materials is not made herein in detail. However, let it suffice here to say, that a ferromagnetic material is one in which magnetic moments of conduction electrons within the ferromagnetic material tend to, on average, align to be both parallel and in the same direction, resulting in a nonzero net magnetic field from the ferromagnetic material.

Most materials like copper, silver, and gold are diamagnetic materials, which do not exhibit a net magnetization. These materials tend to present an extremely weak magnetization opposite and proportional to an applied (external) magnetic field. Diamagnetic materials are also called nonmagnetic materials.

An antiferromagnetic material is one in which magnetic moments within the antiferromagnetic material tend to, on average, align to be parallel, but in opposite directions, resulting in a zero net magnetic field.

As shown, the conventional prior art GMR element 200 can include a seed layer 202 disposed over the substrate, an antiferromagnetic pinning layer 204 disposed over the seed layer 202, and a pinned layer 206 disposed over the antiferromagnetic pinning layer 204. The pinned layer 206 can be comprised of a first ferromagnetic pinned layer 206a, a second ferromagnetic pinned layer 206c, and a spacer layer 206b disposed therebetween.

The conventional GMR element 200 can also include a spacer layer 208 disposed over the second ferromagnetic pinned layer 206c, and a free layer 210 disposed over the spacer layer 208. The spacer layer 206b is a nonmagnetic metallic layer. The spacer 208 is also a nonmagnetic layer, which can be metallic for GMR or insulating for TMR. The free layer 210 can be comprised of a first ferromagnetic free layer 210a and a second ferromagnetic free layer 210b.

A cap layer 212 can be disposed over the free layer 210 to protect the GMR element 200.

Examples of thicknesses of the layers of the conventional prior art GMR element 200 are shown in nanometers. Examples of materials of the layers of the conventional prior art GMR element are shown by atomic symbols.

Within some layers, arrows are shown that are indicative or directions of magnetic field directions of the layers when the GMR element 200 does not experience an external magnetic field. Arrows coming out of the page are indicated as dots within circles and arrows going into the page are indicated as crosses within circles.

Taking the layers from the bottom upward, the seed layer 202 is used to provide a regular crystalline structure upon the substrate that affects crystal properties of layers above.

With regard to the antiferromagnetic pinning layer 204, sub-layers (i.e., layer portions) within the antiferromagnetic pinning layer 204 tend to have magnetic fields that point in alternating different directions indicated by right and left arrows, resulting in the antiferromagnetic pinning layer having a net magnetic field of zero. A top surface of the antiferromagnetic pinning layer 204 tends to have a magnetic moment pointing in one direction, here shown to the left.

With regard to the pinned layer 206, the first ferromagnetic pinned layer 206a tends to couple ferromagnetically to the top surface of the antiferromagnetic pinning layer 204, and thus, the magnetic field in the first ferromagnetic pinned layer 206a can point in the same direction as the magnetic moments at the top surface of the antiferromagnetic pinning layer 204, here shown to the left.

Due to the presence of the spacer layer 206b between the first and second ferromagnetic pinned layers 206a, 206c the second ferromagnetic pinned layer 206c tends to couple antiferromagnetically with the first ferromagnetic pinned layer 206a, and thus, it has a magnetic field pointing in the other direction, here shown pointing to the right. The combination of the three layers 206a, 206b, 206c can be referred to as a synthetic antiferromagnetic structure or layer.

The first and second free layers 210a, 210b have respective magnetic fields pointing out of the page in the absence of an external magnetic field. This pointing direction can be achieved by creating a specific anisotropy along a direction pointing out of the page. That anisotropy can be created by a shape of the GMR element. For example, the anisotropy can be created by patterning the GMR element 200 (top view) to have a yoke shape, or by a crystalline or a magnetic anisotropy. A yoke shape is more fully described below in conjunction with FIG. 5. By created the yoke shape, the free layer 210 has a preferential axis (the yoke axis). If the yoke axis is perpendicular to the reference magnetization a crossed anisotropy can be achieved, which allows obtaining a linear response on a field extension of the order of the free layer anisotropy.

In operation, when the conventional GMR element 200 is exposed to an external magnetic field pointing in a direction of an arrow 214, the magnetic fields in the ferromagnetic free layers 210a, 210b tend to rotate to the right to become more aligned (or fully aligned, i.e., pointing to the right) with the magnetic field pointing direction in the second ferromagnetic pinned layer 206c. However, the magnetic fields in the pinned layer 206 are pinned by the antiferromagnetic pinning layer and do not rotate. The amount of rotation of the magnetic fields in the ferromagnetic free layers 210a, 210b depends upon the magnitude of the external magnetic field. The increased alignment of the magnetic fields in the ferromagnetic free layers 210a, 210b with the direction of the magnetic field in the second ferromagnetic pinned layer 206c tends to make a resistance of the GMR element 200 lower. In particular, resistance tends to vary primarily in the first free layer 210a, in the second (Cu) spacer layer 208, and in the second ferromagnetic (e.g., CoFe) pinned layer 206c.

Conversely, when the GMR element is exposed to an external field pointing opposite to the direction of the arrow 214, the magnetic fields in the free layer 210 tend to rotate to the left to become more anti-aligned (or fully anti-aligned, i.e., pointing to the left) with the magnetic field pointing direction in the second ferromagnetic pinned layer 206c. The amount of rotation depends upon the magnitude of the external magnetic field. The increased anti-alignment of the magnetic fields in the ferromagnetic free layers 210a, 210b with the direction of the magnetic field in the second ferromagnetic pinned layer 206c tends to make a resistance of the GMR element 200 higher.

In view of the above, it will be understood that, referring briefly to FIG. 1, in the absence of an external magnetic field, a resistance of the GMR element 200 is at the center of the linear region 102a, and the resistance can move to the right or to the left on the transfer characteristic curve 102 (i.e., lower or higher) depending upon a direction of the external magnetic field 214. When full alignment or full anti-alignment of layers is achieved, the GMR element 200 will be in the lower saturation region 102e or the upper saturation region 102d, respectively.

In general, the ferromagnetic free layers 210a, 210b tend to naturally have a plurality of magnetic domains, including, but not limited to, a first plurality of magnetic domains with magnetic fields pointing in a first direction and a second plurality of magnetic domains with magnetic fields pointing in one or more other directions. The first plurality of magnetic domains in the ferromagnetic free layers 210a, 210b have magnetic field pointing directions that are aligned with the net magnetic field of the free layer 210, shown to be coming out of the page when the GMR element 200 is not exposed to an external magnetic field, but which can rotate as the GMR element 200 is exposed to a magnetic field. As described above, the magnetic field pointing direction of the first plurality of magnetic domains rotates in response to the external magnetic field. The second plurality of magnetic domains tends to have magnetic field pointing directions that point in one or more other directions.

Simply stated, with regard to the steps 104 of FIG. 1, each step is generated when one or more of the magnetic domains that are not within the first plurality of magnetic domains (e.g., that are within the second plurality of magnetic domains), i.e., one or more of the magnetic domains with magnetic fields not pointing in the direction of the net magnetic field in the ferromagnetic free layers 210a, 210b, suddenly snaps (i.e., jumps) in direction to become aligned with the net magnetic field pointing direction of the magnetic field in the ferromagnetic free layers 210a, 210b, wherever the net field in the ferromagnetic free layers 210a, 210b may be pointing (i.e., may have rotated) in response to an external magnetic field. However, it is also possible that one or more of the magnetic domains with magnetic fields not pointing in the direction of the net magnetic field in the ferromagnetic free layers 210a, 210b more slowly transitions in direction to become aligned with the net magnetic field pointing direction of the magnetic field in the ferromagnetic free layers 210a, 210b, in which case one or more of the steps of FIG. 1 would be less steep than those shown, but still undesirable. Thus, it would be desirable to reduce a number of magnetic domains in the free layer 210 that point in directions other than the direction of the net magnetic field in the free layer 210 (i.e., reduce the quantity of magnetic domains within the second plurality of magnetic domains). This reduction would result in fewer steps 104, smaller steps 104, or no steps 104.

In order to reduce the number of magnetic domains in the free layer 210 that point at directions other than the direction of the net magnetic field of the free layer, i.e., in order to reduce the number of magnetic domains that point in directions other than out of the page, an external biasing magnet can be used. As an alternative, a plurality of layers can be added to the basic GMR element 200 in order to achieve an intra-stack magnetic bias with a so-called "double pinned" arrangement.

Figure 3:
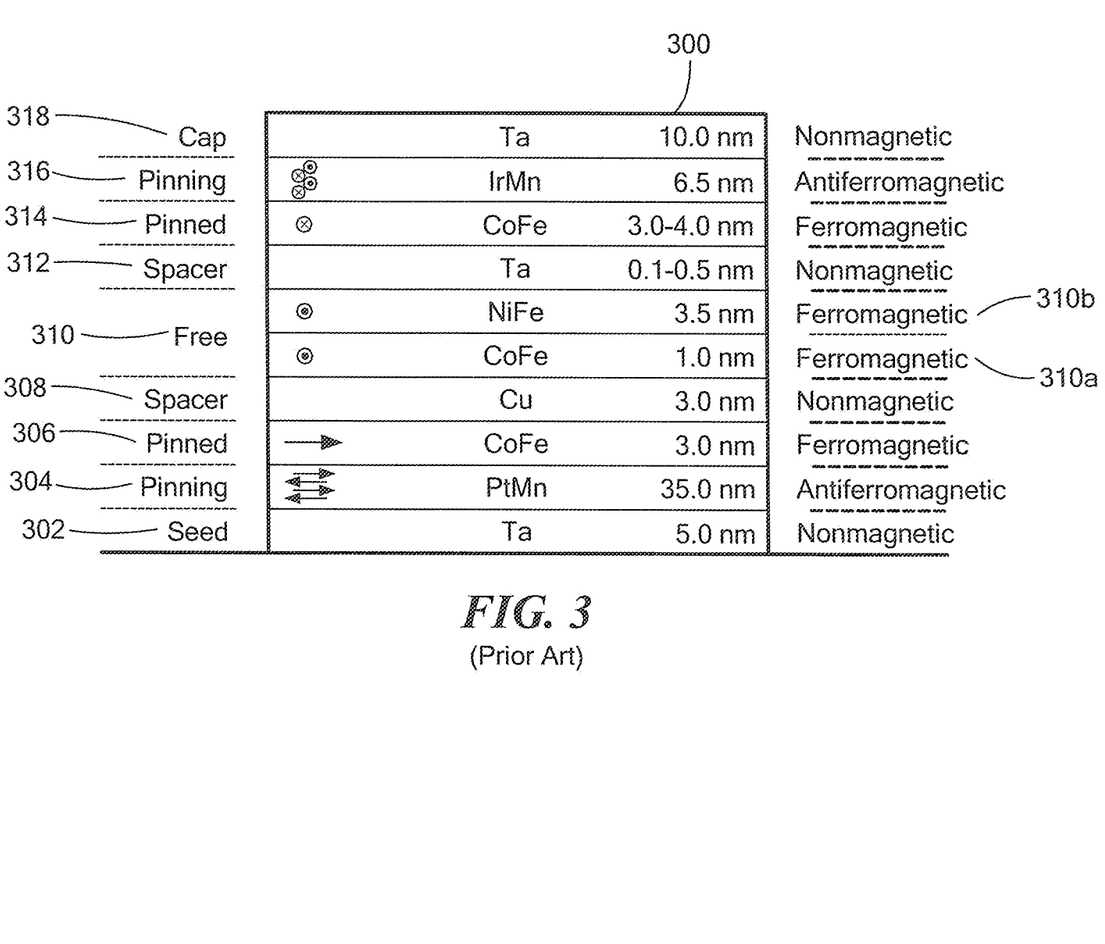
FIG. 3 is a block diagram showing layers of a conventional prior art GMR element with a double pinned arrangement.

Referring now to FIG. 3, a conventional prior art double pinned GMR element 300 can include a nonmagnetic seed layer 302, an antiferromagnetic pinning layer 304 disposed over the seed layer 302, a pinned layer 306 disposed over the pinning layer 304, a spacer layer 308 disposed over the pinned layer 306, and a free layer 310 disposed over the spacer layer. In some arrangements, the free layer 310 can be comprised of two ferromagnetic free layers 310a, 310b. In some arrangements, the spacer layer 308 is a nonmagnetic layer.

The double pinned GMR element 300 can further include a spacer layer 312 disposed over the free layer 310, a second pinned layer 314 disposed over the spacer layer 312, a second pinning layer 316 disposed over the second pinned layer 314, and a nonmagnetic cap layer 318 disposed over the second pinning layer 316. In some arrangements, the spacer layer 312 is a nonmagnetic layer.

Examples of thicknesses of the layers of the GMR element 300 are shown in nanometers. Examples of materials of the layers of the GMR element 300 are shown by atomic symbols.

The prior art double pinned GMR element 300 achieves a magnetostatic field created by the second pinned layer 314. The second pinned layer 314 layer is coupled ferromagnetically to the bottom surface of a second antiferromagnetic pinning layer 316, and thus, the magnetic field in the second pinned layer 314 points in the same direction as the magnetic moments at the bottom surface of the antiferromagnetic pinning layer 316, here shown pointing into the page.

The material used for the second antiferromagnetic pinning layer 316 is different from the one used for the first antiferromagnetic pinning layer 304. In this way the magnetization of the two layers 304, 316 can be manipulated independently by exploiting different blocking temperatures of the two materials (below 230° C. for IrMn and well above 250° C. for PtMn).

The second pinned layer 314 has a magnetic field oriented, here shown to be pointing into the page, to be perpendicular to the magnetic field of the first pinned layer 306. In particular, the pointing direction of the magnetic field created by the second pinned layer 314 and experienced by the free layer 310 causes a reduction in the number of magnetic domains in the free layer 310 that point in directions other than the direction of the net magnetic field of the free layer 310, e.g., a reduction in the number of magnetic domains that point in directions other than out of the page.

A thickness of the spacer layer 312 is chosen to provide a desired magnetic coupling strength between the second pinned layer 314 and the free layer 310. In some embodiments, the thickness of the Ta of the spacer layer 312 is only a few Angstroms, and the coupling takes places also through pinholes in the spacer layer 312. It will be understood that a thickness of a deposition of only a few angstroms is difficult to control, and pinhole density is also difficult to control. Thus, the amount of magnetic coupling between the second pinned layer 314 and the free layer 310 is difficult to control.

For a GMR element, the spacer 308 is a metallic nonmagnetic layer (usually Copper). For a TMR element, the spacer 308 is an insulating nonmagnetic layer (e.g., Al2O3 or MgO). Otherwise, the GMR element 300 can have layers the same as or similar to a comparable TMR element. Thus, a TMR element is not explicitly shown.

Figure 4:
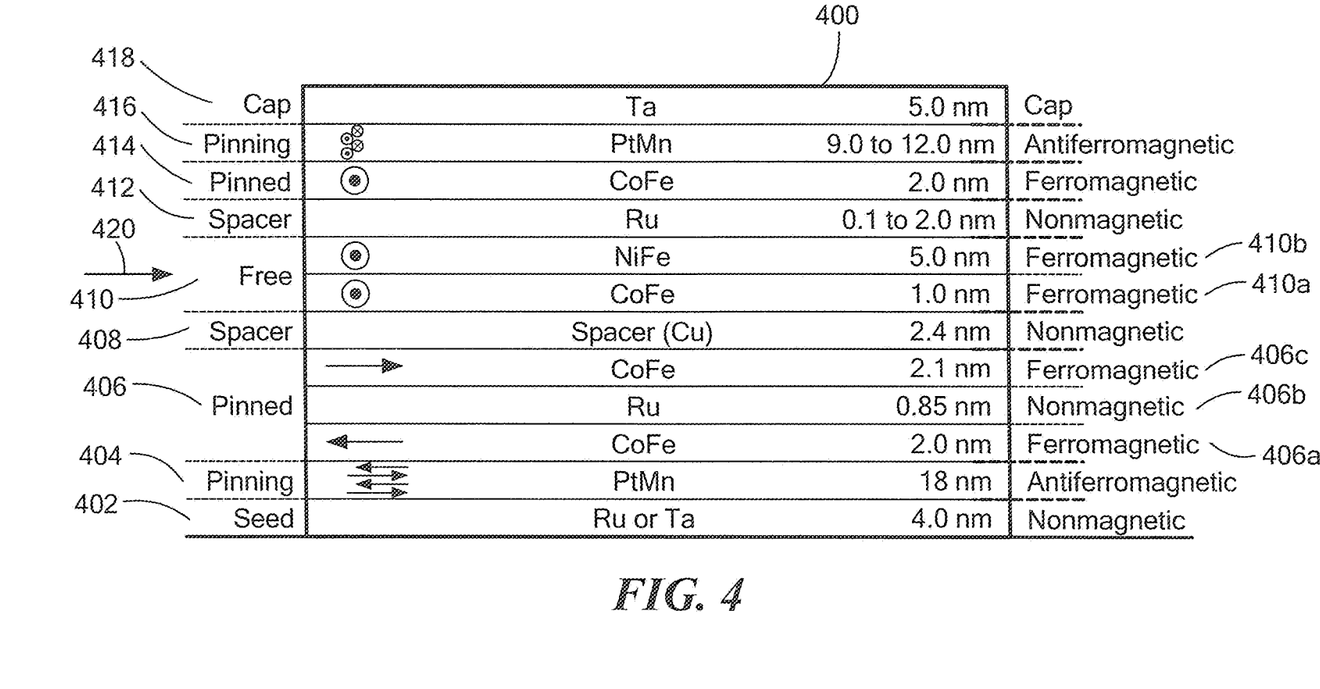
FIG. 4 is a block diagram showing layers of an embodiment of a magnetoresistance element having a particular double pinned arrangement.

Referring to FIG. 4, an example of a double pinned GMR element 400 includes a plurality of layers disposed over a substrate. An upper surface of the substrate is shown as a dark line at the bottom of FIG. 4.

On the left side of FIG. 4, each layer is identified by functional name. On the right side or FIG. 4 are shown magnetic characteristics of sub-layers that can form the functional layers.

Examples of thicknesses of the layers of the GMR element 400 are shown in nanometers. Examples of materials of the layers of the GMR element 400 are shown by atomic symbols.

In general, magnetic materials can have a variety of magnetic characteristics and can be classified by a variety of terms, including, but not limited to, ferromagnetic, antiferromagnetic, and nonmagnetic. Brief descriptions of these types of magnetic materials are given above.

As shown, the exemplary GMR element 400 can include some of the same layers described above for the prior art GMR element of FIG. 3. Like the prior art GMR element of FIG. 3, the exemplary GMR element 400 can include a seed layer 402 disposed over the substrate, an antiferromagnetic pinning layer 404 disposed over the seed layer 402, and a pinned layer 406 disposed over the antiferromagnetic pinning layer 404. However, in some embodiments, the pinned layer 406 can be comprised of a first ferromagnetic pinned layer 406a, a second ferromagnetic pinned layer 406c, and a spacer layer 406b disposed therebetween. In some embodiments, the spacer layer 406b is comprised of a nonmagnetic material.

In some other embodiments, the pinned layer 406 can instead be comprised of one pinned layer, the same as or similar to the pinned layer 306 of FIG. 3.

Due to the presence of the spacer 406b between the first and second ferromagnetic pinned layers 406a, 406c, the second ferromagnetic pinned layer 406c tends to couple antiferromagnetically with the first ferromagnetic pinned layer 406a, and thus, it has a magnetic field pointing in the other direction, here shown pointing to the right. As described above, the combination of the three layers 406a, 406b, 406c can be referred to as a synthetic antiferromagnetic structure or layer.

The exemplary GMR element 400 can also include a spacer layer 408 disposed over the second ferromagnetic pinned layer 406c, and a free layer 410 disposed over the spacer layer 408. In some embodiments, the free layer 410 can be comprised of a first ferromagnetic free layer 410a disposed under a second ferromagnetic free layer 410b. In some embodiments, the spacer layer 408 is comprised of a nonmagnetic material (e.g., conductive Cu for GMR or an insulating material for TMR).

Like the prior art GMR element 300 of FIG. 3, the GMR element 400 of FIG. 4 can further include a spacer layer 412 disposed over the second ferromagnetic free layer 410b, and a second pinned layer 414 disposed over the spacer layer 412. In some embodiments, the second pinned layer 414 can be comprised of a ferromagnetic material. In some embodiments, the spacer layer 412 is comprised of a nonmagnetic material (e.g., Ru)

The GMR element 400 of FIG. 4 can further include a second antiferromagnetic pinning layer 416 disposed over the second pinned layer 414.

A cap layer 418 can be disposed at the top of the GMR element 400 to protect the GMR element 400.

Within some layers, arrows are shown that are indicative or directions of magnetic fields of the layers when the GMR element 400 does not experience an external magnetic field. Arrows coming out of the page are indicated as dots within circles and arrows going into the page are indicated as crosses within circles.

In some embodiments, the seed layer 402 is comprised of Ru or Ta, and the first antiferromagnetic pinning layer 404 is comprised of PtMn. In some embodiments, the first pinned layer 406 is comprised of the first ferromagnetic pinned layer 406a comprised of CoFe, the spacer layer 406b comprised of Ru, and the second ferromagnetic pinned layer 406c comprised of CoFe. In some embodiments, the spacer layer 408 is comprised of Cu (or alternatively, Au, or Ag). In some embodiments, the first ferromagnetic free layer 410a is comprised of CoFe and the second ferromagnetic free layer 410b is comprised of NiFe. In some embodiments, the spacer layer 412 is comprised of Ru (or alternatively, Au, or Ag), the second pinned layer 414 is comprised of CoFe, the second antiferromagnetic pinning layer 416 is comprised of PtMn, and the cap layer 418 is comprised of Ta. However, other materials are also possible.

The spacer layer 412 being comprised of Ru (or Au, or Ag) allows realizable ranges of thicknesses (described below) of the spacer layer 412 to allow for partial pinning of the free layer 420. Partial pinning is described more fully below.

In some other embodiments, the first and second antiferromagnetic pinning layers 404 and 416 can be comprised of IrMn, FeMn, or any other type of antiferromagnetic material. In some other embodiments, the second pinned layer 414 can instead be comprised of a plurality of sublayers, the same as or similar to the sublayers of the first pinned layer 406. In some other embodiments, the spacer layer 408 can be comprised of Ta or Cu.

A thickness of the spacer layer 412 is selected to provide a desired amount of (i.e., a partial) magnetic coupling between the second pinned layer 414 and the free layer 410. Also, the thickness of the spacer layer 412 is selected to provide a desired type of magnetic coupling between the second pinned layer 414 and the free layer 410, i.e., ferromagnetic coupling or antiferromagnetic coupling, or between ferromagnetic and antiferromagnetic coupling. Here, the coupling is shown to be ferromagnetic coupling, but, by selection of the thickness of the spacer layer 412, the coupling can be antiferromagnetic or between ferromagnetic and antiferromagnetic coupling.

In some embodiments for which the spacer layer 412 is comprised of Ru, the thickness of the spacer layer 412 is selected to be within a range of about 0.1 to about 2 nm, but preferably between 0.9 and 2 nm for robustness of the manufacturing process, i.e., thick enough that the spacer layer 412 can be deposited with repeatable and reliable thickness. In some embodiments, a thickness of the spacer layer 412 is greater than 0.5 nm, i.e., greater than a thickness of the spacer layer 312 of the prior art double pinned GMR element 300 of FIG. 3.

Taking CoFe and NiFe to have similar magnetic properties, it will be recognized that the layers of materials above the first ferromagnetic free layer 410a and below the first ferromagnetic free layer 410a are similar, but in reversed order, namely, NiFe (or CoFe)/Ru/CoFe/PtMn. However, it is desired that the spacer layer 406b provides high coupling between surrounding layers, thus it is thin, while it is desired that the spacer layer 412 provide less coupling between surrounding layers, thus it is thicker.

Ru is well suited for the spacer layer 412 because it allows antiferromagnetic or magnetic coupling (also called Ruderman Kittel Kasuya Yoshida or RKKY coupling) between surrounding layers, according to the Ru thickness. In essence, the Ru material permits coupling through it, as opposed to in spite of it. This allows for a thicker Ru layer 412, with a range of achievable thickness values, to achieve and to tune the desired partial pinning of the free layer 410. Partial pinning is more fully described above and below.

In contrast, it should be understood that the Ta spacer layer 312 of FIG. 3 is only used as a nonmagnetic spacer layer and does not provide RKKY coupling. In essence, the Ta spacer layer 312 only decouples the free layer 310 from the pinned layer 314. However, as described above, the Ru spacer layer 412 of FIG. 4 provides RKKY coupling between the free layer 410 and the pinned layer 414.

In some embodiments, the thickness of the Ru spacer layer 412 is selected to provide an RKKY coupling of between about −50 mT and about 50 T. The RKKY coupling tends to be stable with respect to possible process drift, i.e., the amount of coupling tends to remain constant and stable even for a thickness change of about ten percent in the Ru layer due to manufacturing process variations or the like.

Operation of the layers 402-410 is discussed above in conjunction with similar layers in FIGS. 2 and 3.

The second pinned layer 414, having a pinned magnetic field pointing direction aligned with a pointing direction of the magnetic field in the free layer 410, tends to cause particular behavior within the free layer 410. In particular, the pointing direction of the magnetic field in the second pinned layer 414 causes a reduction in the number of magnetic domains in the free layer 410 that point at directions other than the direction of the net magnetic field of the free layer, i.e., a reduction in the number of magnetic domains that point in directions other than out of the page when in the presence of no external magnetic field.

As described above in conjunction with FIG. 2, in general, the ferromagnetic free layers 410a, 410b tend to naturally have a plurality of magnetic domains, including, but not limited to, a first plurality of magnetic domains with magnetic fields pointing in a first direction and a second plurality of magnetic domains with magnetic fields pointing in one or more directions different than the first direction. The first direction described above can be parallel to upper and lower surfaces of the free layer 410. The first plurality of magnetic domains have magnetic field pointing directions that are aligned with the net magnetic field of the free layer 410 shown to be coming out of the page when the GMR element 400 is not exposed to an external magnetic field, but which can rotate as the GMR element 400 is exposed to a magnetic field. As described above, the magnetic field pointing direction of the first plurality of magnetic domains in the free layer 410 rotates in response to an external magnetic field. The second plurality of magnetic domains will tend to have magnetic field pointing directions that point in the one or more directions different than the first direction.

Also as described above in conjunction with FIG. 2, with regard to the steps 104 of FIG. 1, each step is generated when one or more of the magnetic domains that are not within the first plurality of magnetic domains (e.g., that are within the second plurality of magnetic domains), i.e., one or more of the magnetic domains with magnetic fields not pointing in the direction of the net magnetic field in the free layer 410, suddenly snaps (or more slowly rotates) in direction to become aligned with the magnetic field pointing direction of the net magnetic field in the free layer 410, wherever the net magnetic field in the free layer 410 may be pointing (i.e., may have rotated) in response to an external magnetic field.

The second pinned layer 414 is operable to partially magnetically couple, through the spacer layer 412, to the free layer 410, to reduce a number of magnetic domains (i.e., to reduce a quantity of magnetic domains in the second plurality of magnetic domains) in the free layer 410 that point in a direction other than the first direction, i.e., other than the direction of the net magnetic field in the free layer 410 in the absence of an external magnetic field. This reduction results in fewer steps 104, smaller steps 104, or no steps 104. The reduction can include a reduction in a quantity of magnetic domains within the above second plurality of magnetic domains.

By partial pinning, it is meant that there is less magnetic coupling between the second pinned layer 414 and the free layer 410 than between the first pinned layer 406 and the free layer 410. An amount of partial pinning is determined in part by a material and a thickness of the spacer layer 412.

The PtMn first and second antiferromagnetic pinning layer 404, 416 can have a Neel temperature and a blocking temperature that are both above about three hundred degrees Celsius. This high temperature is important to eliminate loss of magnetic characteristics of the GMR element 400 in high temperature applications, for example, automobile applications.

While the layers of the GMR element are shown in a particular order, it should be understood that, in other embodiments, the layers 404, 406 (i.e., 406a, 406b, 406c), and 408 can be exchanged with the layers 416, 414, 412, respectively. In some embodiments, all of the layers shown in FIG. 4 can be reversed in order from bottom to top.

The coupling strength and hence the anisotropy amplitude is controlled by the nonmagnetic spacer layer 412 between the free layer 410 and the second pinned layer 414. In the prior art arrangement of FIG. 3, a very thin Ta spacer 312 is used. In manufacturing, it is difficult to control the thickness of the thin Ta spacer 312, and thus, it is difficult to control the amount of magnetic coupling between the second pinned layer 314 and the free layer 310 of FIG. 3. In contrast, the arrangement of FIG. 4 uses a different nonmagnetic spacer layer 412, allowing a strong RKKY coupling between the second pinned layer 414 and the free layer 410. Ru, Ag, or Au can be used for the spacer layer 412.

RKKY coupling decreases and switches between a maximum antiferromagnetic coupling and a maximum ferromagnetic coupling as the distance between the pinned layer 414 and the free layer 410 increases (i.e., as the thickness of the nonmagnetic spacer layer 412 is increased). A minima of couplings (referred to as a second minimum of coupling) appears between these maxima and occurs at ranges of thicknesses where the coupling can be tuned by way of selection of the thickness. A material of the spacer layer 412 can be chosen around the second minimum of coupling (e.g., 1.6 nm for Ru), which allows a much more reproducible deposition process than currently used for the thin Ta spacer 312 of FIG. 2, which just decreases RKKY coupling rapidly with thickness.

For a GMR element, the spacer layer 408 is a metallic nonmagnetic layer (usually Copper). For a TMR element, the spacer layer 408 is an insulating nonmagnetic layer (e.g., Al2O3 or MgO). Otherwise, the GMR element 400 can have layers the same as or similar to a comparable TMR element. Thus, a TMR element is not explicitly shown.

Figure 5:
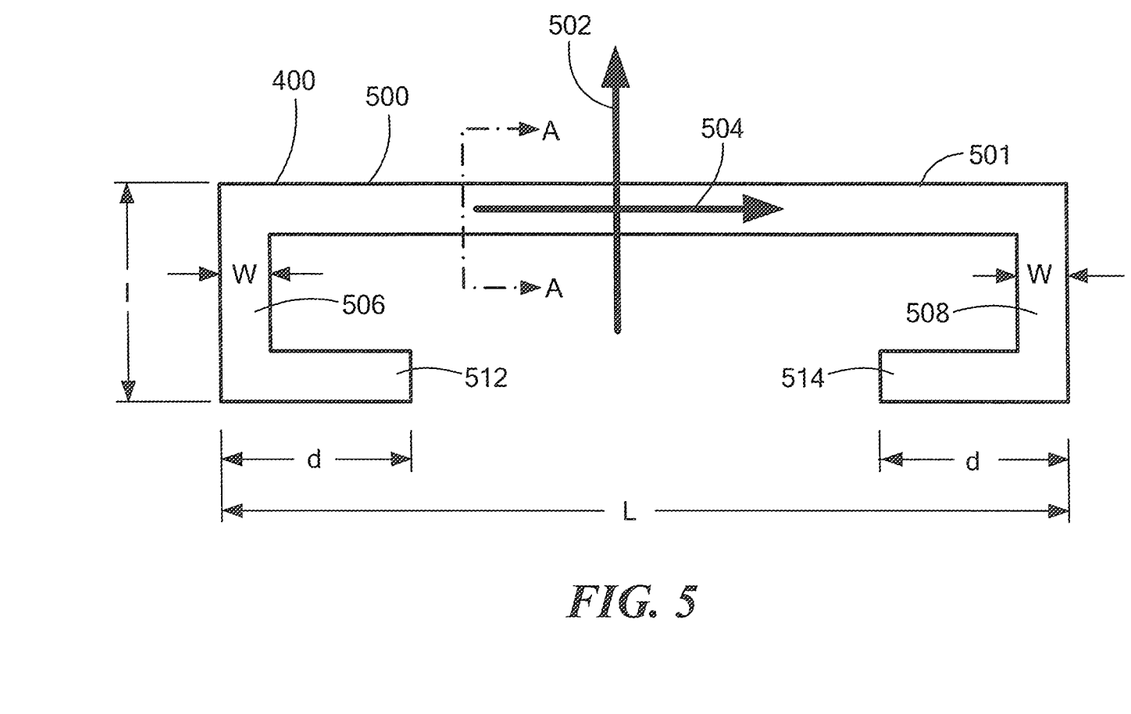
FIG. 5 is a top view diagram of magnetic field sensing element having a yoke shape that, in some embodiments, can describe a shape of the magnetoresistance element of FIG. 4.

Referring now to FIG. 5, in which like elements of FIG. 4 are shown having like reference designations, according to a specific embodiment, the magnetoresistance element 400 of FIG. 4 can be formed in the shape of a yoke 500. A section line A-A shows the perspective of FIG. 4.

The yoke 500 has a main part 501, two arms 506, 508 coupled to the main part 501, and two lateral arms 512, 514 coupled to the two arms 506, 508, respectively. In some embodiments, the main part 501, the two arms 506, 508, and the two lateral arms 512, 514 each have a width (w). However, in other embodiments, the widths can be different.

A length (L) of the yoke 500 and a length (d) of the lateral arms 512, 514 of the yoke 500 are each at least three times the width (w) of the yoke 500, and the width (w) of the yoke 500 can be between about one μm and about twenty μm.

The yoke dimensions can be, for example, within the following ranges:
the length (L) of the main part 501 of the yoke 500 can be between about ten μm and ten millimeters;

the length (l) of the arms 506, 508 of the yoke 500 can be at least three times the width (w);

the width (w) of the yoke 500 can be between about one μm and about twenty μm.

The arms 506, 508 of the yoke 500 are linked to the lateral arms 512, 514, which are parallel to the main part 501, and have a length l which is between about ¼ and ⅓ of the overall length (L).

In general, sensitivity of the magnetoresistance element 400 having the yoke shape 500 decreases with the width (w), and the low frequency noise of the magnetoresistance element 400 increases with the width (w).

The yoke shape offers better magnetic homogeneity in a longitudinally central area of the main part 501. This is due to the demagnetizing field of the yoke length which is mainly along the main part 501, and this induces an anisotropy of the free layer 410 of FIG. 4, which can be seen as a magnetization at zero field along the length of the yoke 500. If the pinned layer (e.g., 406 of FIG. 4) has a magnetic field perpendicular to the yoke (e.g., arrow 502), when an external field is applied in direction of the arrow 502, the free layer 410 magnetization rotates uniformly, i.e. without domain jumps. The homogeneous rotation of the magnetization of the free layer 410 results in a response curve without steps in the response (see, e.g., FIG. 1)

For a GMR element, the overall stack can be designed in a yoke shape, but for a TMR element, in some embodiments, only the free layer can have a yoke shape.

In other embodiments, the GMR or TMR elements 400 is not formed in the shape of a yoke, but is instead formed in the shape of a straight bar, e.g., having the dimensions L and w, and not having features associated with the dimensions l and d. For the bar shaped GMR or TMR element, still the section line A-A is representative of the cross sections of the GMR elements 400 of FIG. 4.

Figure 6:
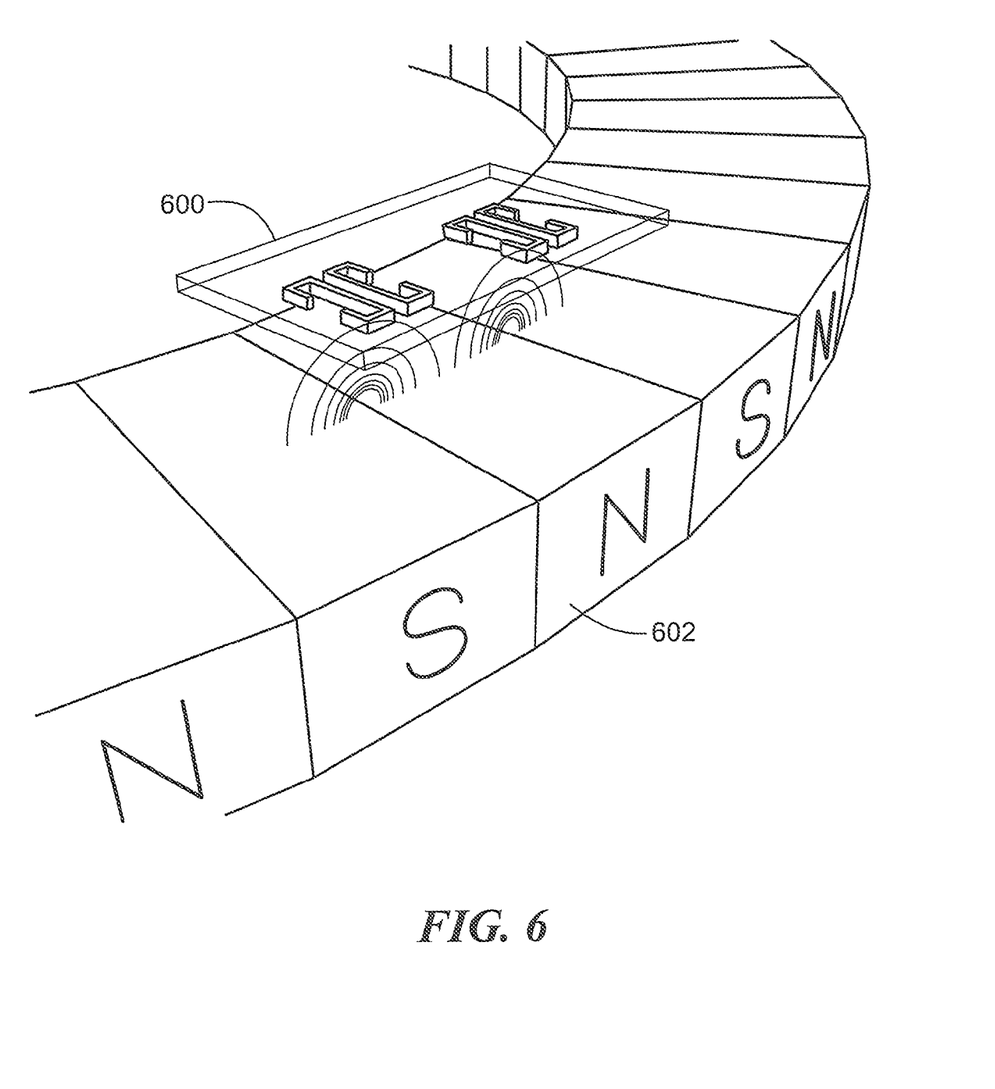
FIG. 6 is a block diagram of a magnetoresistance element magnetic field sensor placed above a magnetic target for rotation speed measurement.

Referring now to FIG. 6, a magnetic field sensor 600 can include one or more magnetoresistance elements. Here, four magnetoresistance elements, which can be of a type described above in conjunction with FIG. 4, are arranged over a common substrate. The four magnetoresistance elements can be arranged in a bridge. Other electronic components (not shown), for example, amplifiers and processors, can also be integrated upon the common substrate.

The magnetic field sensor 600 can be disposed proximate to a moving magnetic object, for example, a ring magnet 602 having alternating north and south magnetic poles. The ring magnet 602 is subject to rotation.

The magnetic field sensor 600 can be configured to generate an output signal indicative of at least a speed of rotation of the ring magnet. In some arrangements, the ring magnet 602 is coupled to a target object, for example, a cam shaft in an engine, and the sensed speed of rotation of the ring magnet 602 is indicative of a speed of rotation of the target object.

While the magnetic field sensor 600 is used as a rotation detector, it should be understood that other similar magnetic field sensors, for example, current sensors, having one or more the magnetoresistance elements of FIG. 4 can also be realized.

Figure 7:
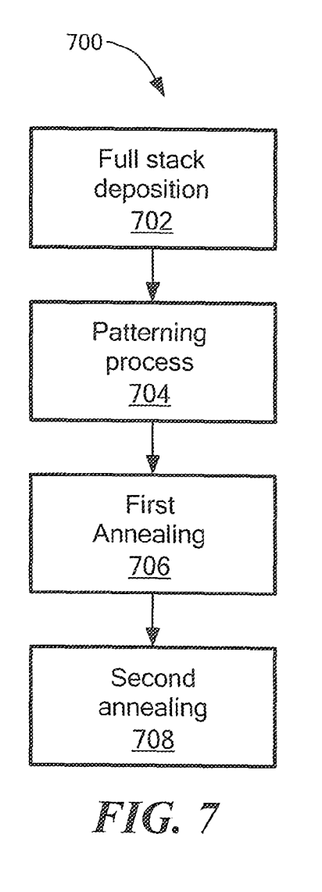
FIG. 7 is a flow chart showing an example of process steps that can be used to form the double pinned GMR element of FIGS. 4 and 5.

It should be appreciated that FIG. 7 shows a flowchart corresponding to the below contemplated technique that would be implemented with semiconductor manufacturing equipment. Rectangular elements (typified by element 704 in FIG. 7), herein denoted "processing blocks," represent process steps.

It will be appreciated by those of ordinary skill in the art that, unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Referring now to FIG. 7, an exemplary process 700 for manufacturing a double pinned GMR element as in FIG. 4 above, begins at block 702, where the full stack 400 of FIG. 4 is deposited in sequential deposition steps. This deposition can be followed at block 704 by a patterning process. The patterning can result, for example, in the yoke shape of FIG. 5.

After the patterning of block 704, a first annealing is applied at block 706 to the processed wafer, where the direction of the magnetic field in the first pinned layer (e.g., 406 of FIG. 4), and also directions in the first antiferromagnetic layer (e.g., 404 of FIG. 4) are defined. Typically the annealing is performed at a temperature T1 with a magnetic field H1 applied parallel to the wafer and, for instance, parallel to the arrow 502 of FIG. 5. This annealing can have, for example, a one hour duration under a magnetic field of 1 T at 295° C., but these values are adapted to the stack composition, i.e., layer materials.

After this first annealing of block 706, at block 708, a second annealing is performed to define the magnetization of the second pinned layer (e.g., 414 of FIG. 4) and of the second antiferromagnetic layer (e.g., 416 of FIG. 4), which provides a magnetic field in the second pinned layer and also in the second antiferromagnetic layer that are oriented perpendicular to the direction of the magnetic field in the first pinned layer (e.g., 406 of FIG. 4) and the directions in the first antiferromagnetic layer (e.g., 404 of FIG. 4). This annealing step can have, for example, a one hour duration, at a temperature 12, which can be equal to T1, and with a magnetic field H2 that is lower than the magnetic field H1. The magnetic field H2 can be applied in a direction parallel to the arrow 504 of FIG. 5. This step is meant to orientate the magnetization of the second pinned layer (e.g., 414 of FIG. 4) without changing the magnetization direction and value of the first pinned layer (e.g., 406 of FIG. 4).

Typical values for a double pinned layer arrangement of FIG. 4 having two PtMn pinning layers 404, 416 are T1=295° C., H1=1 T, for a hour duration, and T2=300° C., H2=20 mT to 100 mT, for a hour duration. However, other values can also be used.

In some embodiments, ranges of values are as follows:
T1=280° C. to 320° C.; H1>0.3 T
T2=280° C. to 320° C.; H2=20 to 60 mT
Durations: 30 minutes to 2 hours Referring now to FIGS. 8 and 9, in which like elements of FIG. 7 are shown having like reference designations, similar processes 800, 900 can be also applied according to the steps of FIG. 7 but in different orders as shown.

Figure 8:
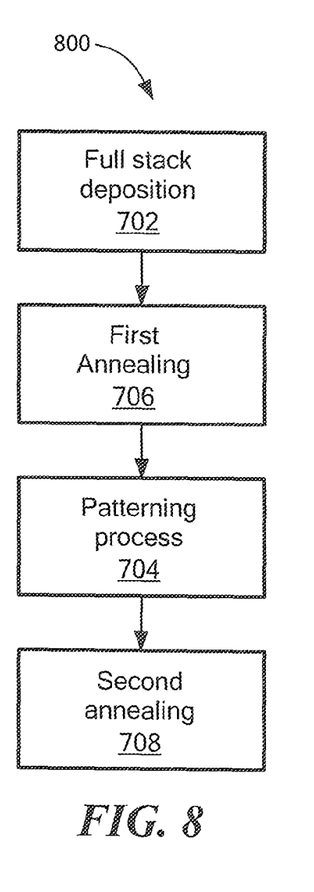
FIGS. 8 and 9 are flow charts showing examples of alternate process steps that can be used to form the double pinned GMR element of FIGS. 4 and 5.
Figure 9:
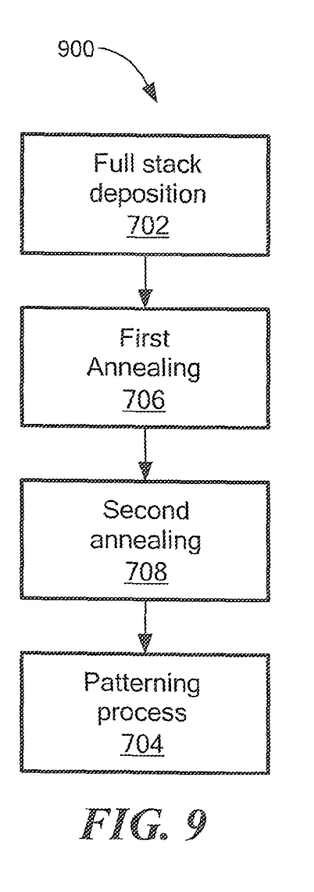

In all of the processes 700, 800, 900, the magnetic field H2 applied during the second annealing is smaller than H1 and applied in another direction, preferably perpendicularly to H1.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetoresistance element, comprising:
a substrate;
a first layer disposed over the substrate, the first layer comprising a seed layer;
a second layer disposed over the first layer, the second layer comprising a first antiferromagnetic pinning layer,
a third layer disposed over the second layer, the third layer comprising a first pinned layer, wherein a position of the second layer is selected to influence a magnetization of the third layer;
a fourth layer disposed over the third layer, the fourth layer comprising a first nonmagnetic spacer layer;
a fifth layer disposed over the fourth layer, the fifth layer comprising a free layer, the free layer having a plurality of magnetic domains, the plurality of magnetic domains comprising:
a first plurality of magnetic domains with magnetic fields pointing in a first direction; and
a second plurality of magnetic domains with magnetic fields pointing in one or more directions different than the first direction;
a sixth layer disposed over the fifth layer, the sixth layer comprising a second pinned layer, wherein the sixth layer consists of a single ferromagnetic layer;
a seventh layer disposed over the sixth layer, the seventh layer comprising a second antiferromagnetic pinning layer, a position of the seventh layer selected to influence a magnetization of the sixth layer, the sixth layer at a selected position relative to the fifth layer, the selected position of the sixth layer relative of the fifth layer resulting in a selected reduction in a quantity of magnetic domains within the second plurality of magnetic domains in the fifth layer without fully pinning the fifth layer; and
an eighth layer disposed between the fifth layer and the sixth and seventh layers taken together, the eighth layer comprising a second nonmagnetic spacer layer, wherein a material of the eighth layer is selected to allow a thickness of the eighth layer to be greater than 0.5 nm while allowing a desired partial pinning between the fifth layer and the sixth layer, wherein the first pinned layer is comprised of:
a first ferromagnetic pinned layer disposed proximate to the second layer;
a third nonmagnetic spacer layer disposed over the first ferromagnetic pinned layer; and
a second ferromagnetic pinned layer disposed over the third nonmagnetic spacer layer,
wherein magnetic field directions in the first and second pinned layers are annealed to be ninety degrees apart, and wherein a magnetic field direction in the second pinned layer is parallel with a magnetic field direction in the second antiferromagnetic pinning layer, and
wherein the first and second antiferromagnetic pinning layers are both comprised of PtMn.

2. The magnetoresistance element of claim 1, wherein the material of the second nonmagnetic spacer layer is selected to allow a thickness of the second nonmagnetic spacer layer of greater than 0.5 nm to allow a magnetic coupling between the fifth layer and the sixth layer to be between a fully ferromagnetic coupling and a fully antiferromagnetic coupling.

3. The magnetoresistance element of claim 1, wherein the second nonmagnetic spacer layer is comprised of a material selected to provide an adjustable RKKY coupling between the fifth layer and the sixth layer.

4. The magnetoresistance element of claim 1, wherein the second nonmagnetic spacer layer is comprised of Ru.

5. The magnetoresistance element of claim 4, wherein a thickness of the second nonmagnetic spacer layer is between about 0.9 nm and about 2 nm.

6. The magnetoresistance element of claim 1, wherein the second nonmagnetic spacer layer is comprised of a selected one of Ru, Ag, or Au.

7. The magnetoresistance element of claim 6, wherein a thickness of the second nonmagnetic spacer layer is between about 0.9 nm and about 2 nm.

8. The magnetoresistance element of claim 1, wherein a thickness of the second nonmagnetic spacer layer is between about 0.9 nm and about 2 nm.

9. The magnetoresistance element of claim 1, wherein a material and a thickness of the second nonmagnetic spacer layer is selected to result in a partial pinning of the fifth layer, the particle pinning corresponding to less magnetic coupling between the sixth layer and the fifth layer than between the third layer and the fifth layer.

10. The magnetoresistance element of claim 1, wherein the second nonmagnetic spacer layer is comprised of Ru and wherein the thickness of the second nonmagnetic spacer layer is between about 0.5 nm and about 1.7 nm.

11. The magnetoresistance element of claim 10, wherein the second nonmagnetic spacer layer provides an RKKY coupling between the fifth layer and the sixth layer between about −50 mT and about 50 T.

12. The magnetoresistance element of claim 1, wherein the material of the second antiferromagnetic pinning layer is selected to have a Neel temperature and a blocking temperature both above three hundred degrees Celsius.

13. The magnetoresistance element of claim 1, layers are both comprised of CoFe.

14. The magnetoresistance element of claim 13, wherein the first and second ferromagnetic pinned layers are comprised of CoFe and the third nonmagnetic spacer layer is comprised of Ru.

15. The magnetoresistance element of claim 1, wherein at least a portion of the magnetoresistance element has a yoke shape.

16. The magnetoresistance element of claim 15, wherein a length (L) of the yoke shape and a length (d) of the lateral arms of the yoke shape are each at least three times a width (w) of the yoke shape, and the width (w) of the yoke shape is between about one μm and about twenty μm, wherein the length (L) is a longest dimension of the yoke shape.

17. A method of fabricating a magnetoresistance element, comprising:
depositing a double pinned magnetoresistance element upon a substrate, the double pinned magnetoresistance element comprising:
a first antiferromagnetic pinning layer disposed over the substrate;
a first pinned layer disposed over the antiferromagnetic pinning layer;
a first nonmagnetic spacer layer disposed over the first pinned layer;
a free layer disposed over the first nonmagnetic spacer layer;
a second pinned layer disposed over the free layer, wherein the second pinned layer consists of a single ferromagnetic layer;
a second antiferromagnetic pinning layer disposed over the second pinned layer;

and
a second nonmagnetic spacer layer disposed between the second pinned layer and the free layer, wherein a material of the second nonmagnetic spacer layer is selected to allow a thickness of the second nonmagnetic spacer layer to be greater than 0.5 nm while allowing a desired partial pinning between the second pinned layer and the free layer,
wherein the first pinned layer is comprised of:
a first ferromagnetic pinned layer disposed proximate to the second layer;
a third nonmagnetic spacer layer disposed over the first ferromagnetic pinned layer; and
a second ferromagnetic pinned layer disposed over the third nonmagnetic spacer layer
wherein magnetic field directions in the first and second pinned layers are annealed to be ninety degrees apart, and wherein a magnetic field direction in the second pinned layer is parallel with a magnetic field direction in the second antiferromagnetic pinning layer, and
wherein the first and second antiferromagnetic pinning layers are both comprised of PtMn.

18. The method of claim 17, wherein the material of the second nonmagnetic spacer layer is selected to allow a thickness of the second nonmagnetic spacer layer of greater than 0.5 nm to allow a magnetic coupling between the second pinned layer and the free layer to be between a maximum ferromagnetic coupling and a maximum antiferromagnetic coupling.

19. The method of claim 17, further comprising:
annealing the first pinned layer and the first antiferromagnetic layer at a first annealing temperature, with a first annealing magnetic field, with a first annealing magnetic field direction, and with a first annealing duration;
annealing the second pinned layer and the second antiferromagnetic layer at a second annealing temperature, with a second annealing magnetic field, with a second annealing magnetic field direction, and with a second annealing duration, wherein:
the first annealing magnetic field direction is in a selected magnetization direction,
the second annealing magnetic field direction is orthogonal to the first annealing magnetic field direction, and
the first annealing magnetic field is higher than the second annealing magnetic field, wherein the second annealing magnetic field is selected to result in annealing of the second pinned layer and annealing of the second antiferromagnetic layer without affecting the annealing of the first pinned layer or the annealing of the first antiferromagnetic layer.

20. The method of claim 18, wherein the first annealing magnetic field is about one Tesla, and wherein the second annealing magnetic field is in a range of about twenty milliTesla to about one hundred milliTesla.

21. The method of claim 20, wherein the first annealing temperature is about two hundred ninety five degrees Celsius, wherein the second annealing temperature is about three hundred degrees Celsius, and wherein the first annealing duration is about one hour and the second annealing duration is about one hour.

22. The method of claim 21, wherein the first and second pinned layers are both comprised of CoFe.

23. The method of claim 17, wherein the first and second pinned layers are both comprised of CoFe.

24. The method of claim 17, wherein the second nonmagnetic spacer layers is comprised of Ru and a thickness of the second nonmagnetic spacer layer is between about 0.9 nm and about 2 nm.

25. The method of claim 17, wherein the second nonmagnetic spacer layers is comprised of Ru and a thickness of the second nonmagnetic spacer layer is between about 0.5 nm and about 1.5 nm.

26. The method of claim 25, wherein the second nonmagnetic spacer layer provides an RKKY coupling between the free layer and the second pinned layer between about −50 mT and about 50 T.

27. The method of claim 17, wherein the depositing a double pinned magnetoresistance element comprises depositing at least a portion of the double pinned magnetoresistance element in a yoke shape.

28. The method of claim 27, wherein a length (L) of the yoke shape and a length (d) of the lateral arms of the yoke shape are each at least three times a width (w) of the yoke shape, and the width (w) of the yoke shape is between about one μm and about twenty μm, wherein the length (L) is a longest dimension of the yoke shape.

* * * * *

UNITED STATES PATENT AND TRADEMARK OFFICE
CERTIFICATE OF CORRECTION

PATENT NO. : 9,529,060 B2
APPLICATION NO. : 14/452783
DATED : December 27, 2016
INVENTOR(S) : Claude Fermon et al.

It is certified that error appears in the above-identified patent and that said Letters Patent is hereby corrected as shown below:

On the Title Page (73) Assignee: Allegro MicroSystems, LLC,
Worcester, MA (US)

Should be corrected to read:

(73) Assignees: Allegro MicroSystems, LLC,
Worcester, MA (US)

Commissariat A L'Energie Atomique et aux Energies Alternatives,
Paris (FR)

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*